United States Patent [19]
Kay et al.

[11] Patent Number: 5,491,456
[45] Date of Patent: Feb. 13, 1996

[54] OSCILLATOR COMPENSATED FOR IMPROVED FREQUENCY STABILITY

[75] Inventors: Michael R. Kay, Richardson; Frank L. Thiel, V, Austin, both of Tex.

[73] Assignee: Texas Instruments Incorporated, Dallas, Tex.

[21] Appl. No.: 352,315

[22] Filed: Dec. 8, 1994

[51] Int. Cl.$^6$ .............................. H03B 5/24; H03B 5/04; H03L 1/00; H03K 3/011
[52] U.S. Cl. ............................ 331/57; 331/143; 331/173; 331/176
[58] Field of Search ........................ 331/57, 111, 108 C, 331/143, 153, 173, 175, 176, DIG. 3

[56] References Cited

U.S. PATENT DOCUMENTS

| | | | |
|---|---|---|---|
| 4,205,279 | 5/1980 | Beutler | 331/111 |
| 4,283,690 | 8/1981 | Tarbouriech | 331/111 |
| 5,021,750 | 6/1991 | Schnabel | 311/111 |
| 5,250,914 | 10/1993 | Kondo | 331/175 X |

*Primary Examiner*—David Mis
*Attorney, Agent, or Firm*—Paul C. Hashim; W. James Brady, III; R. L. Donaldson

[57] ABSTRACT

An oscillator is provided for use in integrated circuits of the type that are employed in various, relatively low power, power management systems such as can be found in mobile communications systems and the like. The oscillator provides an output frequency that is highly stable over a range of conventional operational parameters. The oscillator provides a current generator that is comprised of a pair of NMOS transistors and a pair of PMOS transistors that are arranged such that the respective gates of each pair are connected to one another to establish current mirroring. The current generator is connected to a hysteresis circuit, which is operable to develop a potential difference in the circuit. The hysteresis circuit includes an NMOS transistor and a PMOS transistor that are respectively and correspondingly coupled to the current-mirroring NMOS and PMOS transistor pairs of the current generator. The hysteresis circuit also includes second, gate-connected NMOS and PMOS transistors and a switch array that is comprised of connected NMOS/PMOS transistor pairs. The NMOS/PMOS transistor pairs of the switch are operable in tandem such that no more than one of the NMOS/PMOS transistor pairs is closed at any time during operation of the circuit. A feedback control system is provided to regulate oscillator switch operation.

14 Claims, 4 Drawing Sheets

OSCILLATOR COMPENSATED FOR IMPROVED FREQUENCY STABILITY

TECHNICAL FIELD OF THE INVENTION

This invention relates generally to integrated circuits, and more particularly to oscillators for use in integrated circuits such as those that are used in various power management systems.

BACKGROUND OF THE INVENTION

It has become increasingly desirable to incorporate oscillators into integrated circuit design, especially in CMOS and BiCMOS circuits. It is especially desirable, for reasons of cost, simplicity and spatial economy, to render the oscillator as a self-contained circuit having no external circuit components. It is generally desirable to configure such oscillators as components that are frequency stable over a range of variable external parameters, such as temperature, input voltage, and process dependent component parameter. Moreover, it is generally desirable to configure oscillators that have minimal power requirements and footprint, especially when the oscillator is to be incorporated into mobile D.C. power components, such as cellular communications and portable computer equipment.

Notwithstanding the foregoing design objectives, conventional oscillators oftentimes exhibit a frequency error of ±30% for each of these external parameters as any one parameter is varied over its typical range of values. For example, such frequency fluctuations are encountered over temperature ranges of about −50° C. to 150° C., voltages of about 2.5 V–10 V, and transistor strength (i.e., current gain ) fluctuations of ±30%. The foregoing errors can cumulatively introduce an error of up to about ±70%, which is clearly unacceptable for many applications.

Prior art systems have attempted to overcome the foregoing deficiencies, but none have been entirely satisfactory. In U.S. Pat. No. 4,283,690, a low power CMOS oscillator is disclosed for the purpose of maintaining frequency fluctuations within a prescribed range during voltage supply variations. The oscillator is connected to an external circuit through a pin. The system employs an external capacitor that is connected to the inputs of two inverters. One of the inverters is used to drive a p-channel transistor, while the other inverter is connected to an n-channel transistor. Both of the transistors are connected in series and provide an output from a node that is formed between the two transistors. The output of a latch that is connected to the node is coupled to the capacitor to effect capacitor charge and discharge. Disadvantages of this system include the provision of an external capacitor, thereby increasing the cost and spatial requirements of the oscillator, and the use of a pin for connecting to a circuit, thereby reducing the number of available pin connections for other functions.

The problems of temperature and parameter stability in a CMOS oscillator were more recently addressed in U.S. Pat. No. 5,021,750. The disclosed oscillator includes a two-stage differential amplifier and two controlled current sources which are interconnected by a frequency-determining capacitor. The two current sources are connected to the inputs of the differential amplifier through first and second resistors. First and second switching units connected to the differential amplifier and first and second resistors, respectively, complete first and second current paths in response to voltage drops across the first and second resistors to charge the capacitor to first and second respective charge space. Disadvantages of the disclosed CMOS oscillator include the use of a differential amplifier. Such amplifiers typically do not operate efficiently to low values of $V_{DD}$. Moreover, the disclosed oscillator provides six current paths as well as a multitude of resistors, thereby requiring considerably more power and die area than is desired in self-powered, portable systems.

Accordingly, there exists a need for compact, self-contained "building block" oscillators for CMOS-type circuits to replace existing, external circuits and which are frequency stable over a wide range of operation parameters to, among other things, provide power management in mobile and other types of communications systems.

SUMMARY OF THE INVENTION

An oscillator is provided for use in integrated circuits of the type that are employed in various, relatively low power, power management systems such as can be found in mobile communications systems and the like. The oscillator provides an output frequency that is highly stable over a range of conventional operational parameters, such as temperature. The oscillator provides a current generator that is comprised of a pair of NMOS transistors and a pair of PMOS transistors that are arranged such that the respective gates of each pair are connected to one another to establish current mirroring. The current generator is connected to a hysteresis circuit, which is operable to develop a potential difference in the circuit. The hysteresis circuit includes an NMOS transistor and a PMOS transistor that are respectively and correspondingly coupled to the current-mirroring NMOS and PMOS transistor pairs of the current generator. The hysteresis circuit also includes second, gate-connected NMOS and PMOS transistors and a switch array that is comprised of connected NMOS/PMOS transistor pairs. The NMOS/PMOS transistor pairs of the switch are operable in tandem such that no more than one of the NMOS/PMOS transistor pairs is closed at any time during operation of the circuit. A feedback control system is provided to regulate oscillator switch operation.

BRIEF DESCRIPTION OF THE DRAWINGS

These and other features of the invention will be apparent to those skilled in the art from a reading of the following detailed description of the invention, taken together with the accompanying drawings, in which.

DETAILED DESCRIPTION OF THE PREFERRED EMBODIMENTS

Figure 1:
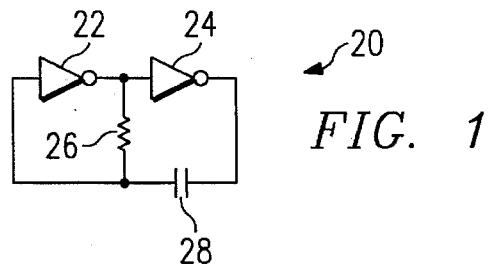
FIG. 1 is a schematic illustration of a prior art astable oscillator circuit.
Figure 2:
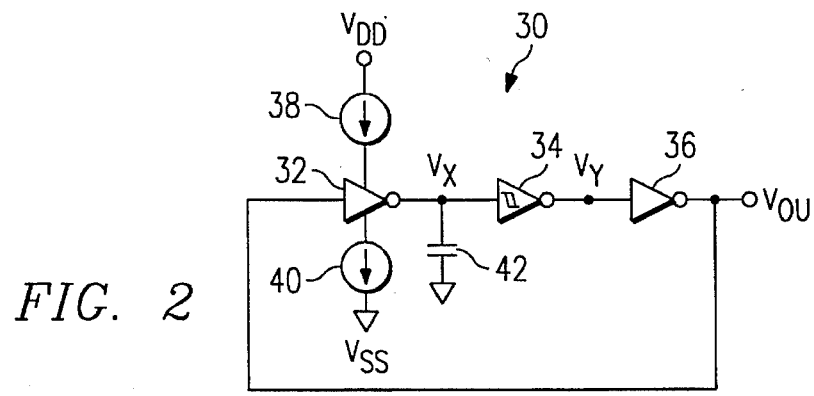
FIG. 2 is a schematic illustration of another known astable oscillator circuit.

With reference to the drawings, wherein like reference characters represent similar components throughout the various views, and with particular reference to FIGS. 1 and 2, there are depicted top-level schematic illustrations of basic astable multivibrator oscillator circuits. With particular reference to FIG. 1, the illustrated circuit, denoted generally by reference numeral 20, comprises a serial array of first and second inverters 22 and 24 across which is connected a resistor 26 and capacitor 28. Astable multivibrators are commonly used to implement an oscillator on an integrated circuit. However, such devices do not have any stable states; instead, they oscillate between two quasi-stable states. As there exists a nearly limitless number of ways to implement such types of oscillator circuits, circuit designers vary the arrangement of circuit elements, trading-off various circuit performance characteristics in an effort to obtain favorable performance characteristics for the intended implementation of the circuit. Some of these basic performance parameters include: frequency change as a function of $V_{DD}$ (voltage powering the circuit), temperature, and process parameters; power consumption; circuit die area required for implementation; and maximum/minimum frequency attainability.

For this type of RC oscillator, power is a function $V_{DD}$ and circuit resistance. Accordingly, the frequency of oscillation changes appreciably with changes in $V_{DD}$. The frequency of oscillation is itself a function of circuit resistance ($R_x$) and capacitance ($C_x$). Astable oscillators of the type illustrated in FIGS. 1 and 2 trade-off power and circuit die area by varying the size of resistance ($R_x$) and, to a lesser extent, capacitance ($C_x$). As all such oscillators trade-off power for die area, this trade-off becomes unimportant for oscillators with sufficiently large predetermined and spatial requirements, unless other power consuming components are utilized, as is the case with the circuit disclosed in U.S. Pat. No. 5,021,750, in which at least two resistors are utilized, thereby increasing circuit power requirements. Accordingly, the remaining benchmark components relate to the stability of oscillation frequency as a function of other parameters such as $V_{DD}$, temperature and integrated circuit process parameters such as the MOS transconductance parameter (k'), threshold voltage, channel length, and the like. As will be described in greater detail below, the oscillator circuit of the present invention achieves a substantially stable frequency across these specified parameters, and maximizes power/die area efficiency.

FIG. 2 provides another illustration of an astable multivibrator. The multivibrator 30 includes a serial array of inverters 32, 34, and 36. The inverter 32 is connected between current sources ($I_P$) 38 and ($I_N$) 40, where $I_P$ represents the current source for the inverter P-transistor and $I_N$ represents the current source for the inverter N-transistor, as will be explained in greater detail below. A capacitor 42 is interposed between inverters 32 and 34. Depending upon the status of the transistors (not shown) comprising the inverter 32, the capacitor 42 will be either charged or discharged. Current through the inverter 32 is linear in accordance with the status of its transistors.

Figure 3:
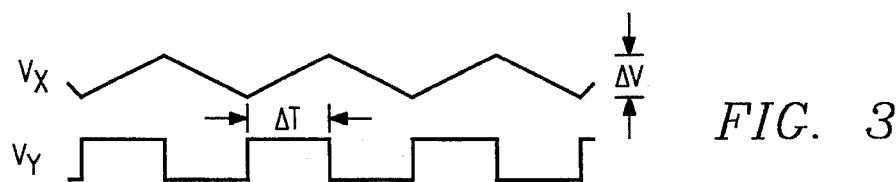
FIG. 3 is a schematic illustration voltage output from the circuit depicted in FIG. 2.

The downstream inverter 34 is a hysteretic inverter (i.e., Schmitt trigger). The provision of a hysteretic inverter 34 affects the voltage through the circuit, as indicated in FIG. 3, which depicts voltage sampled at nodal points designated $V_x$ and $V_y$ as a function of time. The triangular wave graph for $V_x$ is a result of the hysteresis effect of the inverter 34. This voltage fluctuates linearly as a function of time. In contrast, voltage sampled at nodal point $V_y$ is characterized by sharply-defined high and low plateaus. The voltage change ($\Delta V$) for the triangular wave graph illustrated in FIG. 3 represents the magnitude of hysteresis of the inverter/Schmitt trigger 34.

Current/Voltage (I/V) characteristics in the capacitor 42 bear the relationship:

$$I_p = C(\Delta V)/(\Delta T) \tag{1}$$

where C=capacitance, $\Delta V$=change in voltage, T=time period, and assuming $I_p = I_N$. From equation (1) it follows that, for a full cycle, $$\Delta T = 2C\Delta V/I. \tag{2}$$

As frequency (F) is inversely proportional to time, it therefore follows, $$F = 1/\Delta T = I/2C(\Delta V). \tag{3}$$

It is desirable to design a circuit for which circuit current ($I_p$) and voltage ($\Delta V$) follow identical, or nearly identical, functions of source voltage ($V_{DD}$), temperature and transistor processing parameters such that you obtain cancellation of the parameters in equation (3) is obtained, as will be explained in detail below. Attainment of such a circuit will create a frequency that is independent of these three considerations. The manner in which the circuitry of the present invention accomplishes this objective will be described in detail below.

Figure 4:
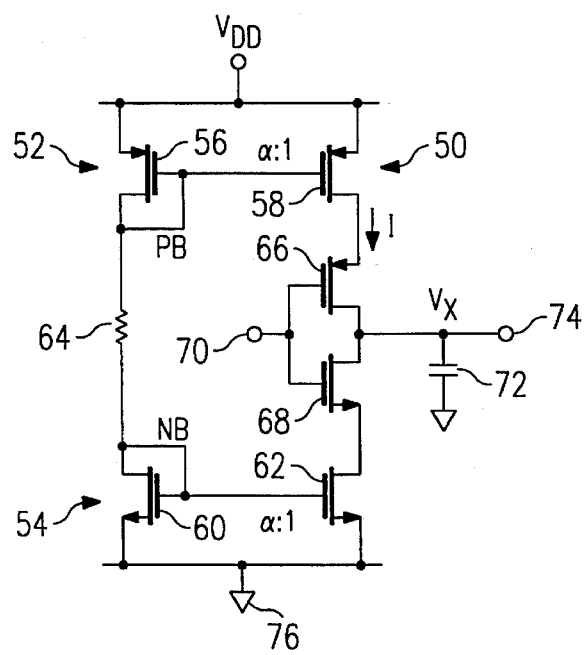
FIG. 4 is a schematic illustration of a current generator circuit in accordance with the present invention.

With reference to FIG. 4, there is depicted a current generator circuit 50 in accordance with the present invention that includes first and second current mirrors 52 and 54, respectively, which facilitate the control of current through the circuit, as described by equation (3) above. The direction of current flow through the circuit is indicated by arrow I. The first current mirror 52 is comprised of first and second PMOS transistors 56 and 58. The second current mirror 54 is comprised of NMOS transistors 60 and 62. The two source terminals of PMOS transistors 56 and 58 are connected to the supply voltage terminal $V_{DD}$. PMOS transistor 56 has its drain/gate connected to the drain of NMOS transistor 60 through resistor 64. The gates of transistors 56 and 58 are interconnected. PMOS transistor 58 serves as the current source ($I_p$) for the current mirror 52. The drain of PMOS transistor 58 is connected to the source of the first of two series transistors: PMOS transistor 66 and NMOS transistor 68, which together represent an inverter. The transistors 66 and 68 act as switches, with only one switch being closed at a given time to control which current source (58 or 62) is connected to capacitor 72 at node $V_x$. A control signal is supplied to the parallel transistors 66, 68 from a position outside the circuit, as indicated at node 70. Output from the transistor pair 66, 68 can be directed to capacitor 72, the voltage output of which is directed to a hysteresis circuit, indicated generally by referenced character 74.

With reference once again to current mirror 54, the source of the respective transistors 60 and 62 are connected to ground 76, whereas the drain/gate of transistor 60 is connected through resistor 64 to the drain/gate of transistor 56.

The gates of transistors 60 and 62 are interconnected. The drain of transistor 62 is connected to the source of transistor 68. NMOS transistor 62 serves as the current source for current mirror 54. Accordingly, the current ratio ($\alpha$) of the transistor pairs 56 & 58 and 60 & 62 comprising each of the current mirrors 52 and 54 is 3:1 in this embodiment, and the size differential between transistors 56 & 58 and 60 & 62 is 3:1.

A common engineering derivative of Ohm's law provides the fundamental relationship for circuit components as follows:

$$V = IR \tag{4}$$

where V=voltage, I=current, and R=resistance. With respect to the particular components comprising the circuit illustrated in FIG. 4, it follows from Ohm's law that $$\alpha I = (V_{DD} - V_{GSP56} - V_{GSP60})/Rx \tag{5}$$

where $\alpha$=the ratio of current between transistors 56 & 58 and 60 & 62; $V_{DD}$= voltage power supply; $V_{GSP56}$=the gate-to-source voltage on transistor 56; $V_{GSN60}$=the gate-to-source voltage on transistor 60; and $R_x$=the resistance of circuit resistor 64. Current I through the circuit can therefor be represented as follows:

$$I = \frac{(V_{DD} - V_{GSP56} - V_{GSN60})}{\alpha R_x} \tag{6}$$

Figure 5:
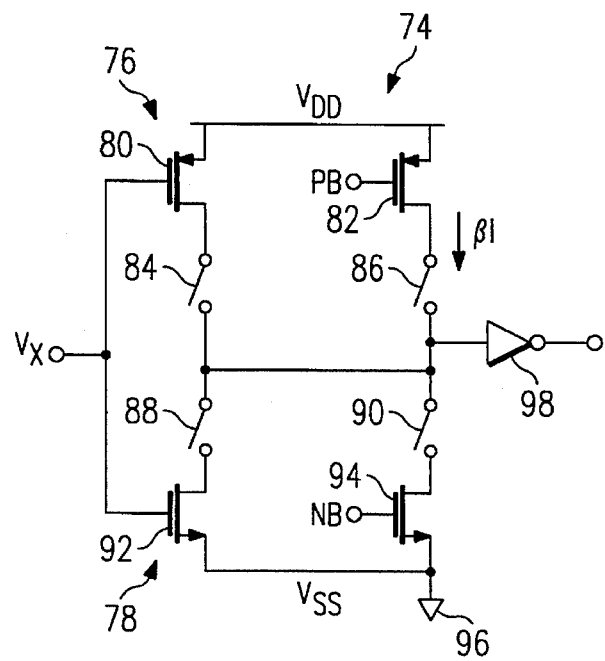
FIG. 5 is schematic illustration of a hysteresis circuit in accordance with the present invention.

The gate-to-source voltage ($V_{GSP1}$) is as follows:

$$V_{DD} - PB = V_{GSP56} = \sqrt{\alpha \frac{I}{(W/L)_{P56} k_{P56}'}} + V_{TP56} \tag{7}$$

where PB=the bias voltage on the gate of the current source; $\alpha$=the current ratio as defined; W=the width of the transistor in microns; L=the transistor length (in microns), $k_{P56}$=the transconductance parameter of the transistor 56 amps/volt$^2$; and $V_{TP56}$=the threshold voltage for the transistor 56. The gate-to-source voltage for NMOS transistor 60 ($V_{GSN60}$) can be obtained from the following relationship:

$$NB = V_{GSN60} = \sqrt{\alpha \frac{I}{(W/L)_{N60} k_{N60}'}} + V_{TN60} \tag{8}$$

where NB=the bias voltage on the gate of the current source 62; W and L respectively represent the width and length (in microns) of NMOS transistor 60; $V_{TN60}$ represents the threshold voltage of the transistor 60; and $k_{N60}$=the transconductance parameter of NMOS transistor 60;

Details of the hysteresis circuit 74 in FIG. 4 (34 in FIG. 2) that is responsible for the generation of a change in potential in accordance with the teachings of the present invention are illustrated in FIG. 5. With reference to FIG. 5, the hysteresis circuit 74 is comprised of two PMOS transistors 80 and 82, the sources of which are connected to voltage source $V_{DD}$. PMOS transistor 82 mirrors the current from transistor 56 (FIG. 4) and is a current source with gate bias coming from PB in FIG. 4. PMOS transistors 80 & 82 are connected to a switch assembly 83 that is comprised of an array of four transistors/switches 84, 86, 88 & 90. The drain of PMOS transistor 80 is connected to switch 84. The drain of PMOS transistor 82 is connected to switch 86. Switches 84 and 86 are PMOS transistors. Switch 84 is connected in series to switch 88, whereas switch 86 is connected in series to switch 90. Switches 88 and 90 are NMOS transistors. Circuit 74 also includes two NMOS transistors 92 and 94. Paths between switch pairs 84 & 88 and 86 & 90 are interconnected. The gate from PMOS transistor 80 is connected to the gate of NMOS transistor 92.

Figure 7A:
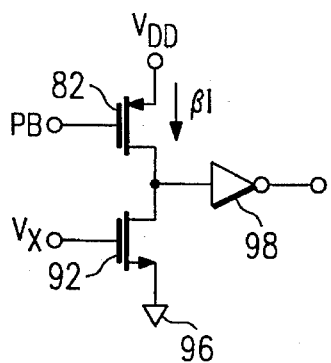
FIG. 7A and 7B are each a schematic illustration of a portion of the circuit depicted in FIG. 5.
Figure 7B:
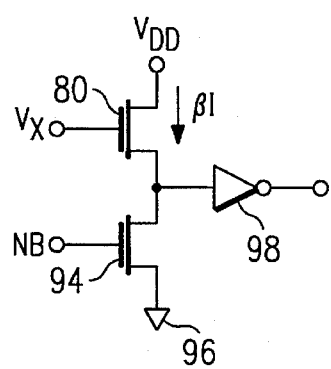

Switch 88 is connected to the drain of NMOS transistor 92. Switch 90 is connected to the drain of NMOS transistor 94. The sources of the NMOS transistors 92 and 94 are connected to node 96 ($V_{SS}$). PMOS transistor 82 and NMOS transistor 94 are circuit current sources. PB represents the bias voltage on the gate of current source/PMOS transistor 82. NB represents the bias voltage on the gate of current source/NMOS transistor 94. Diagonally opposed switches 84 & 90 and 86 & 88, respectively, operate in tandem such that, when switches 86 & 88 are closed, switches 84 & 90 are open. When the respective switches are in the foregoing mode, PMOS transistor 80 and NMOS 94 drop out of the circuit, resulting in the coupling of PMOS transistor 82 to NMOS transistor 92. Output from the circuit transistors 82 and 92 is directed to inverter 98 for further processing. This describes the low side switch point of the circuit, as illustrated FIG. 7A, and which is plotted with NB in FIG. 8. The high side switch point of the circuit occurs when switches 86 & 88 are open, and switches 84 & 90 are closed. Attainment of the high side switch point effectively removes PMOS transistor 82 and NMOS transistor 92 from the circuit, as shown in FIG. 7B.

Figure 6:
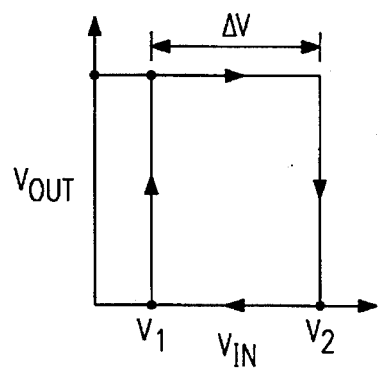
FIG. 6 is a graphic illustration of voltage input and output in a hysteresis circuit.

Voltage flow in a hysteresis circuit such as circuit 74 is illustrated in FIG. 6, in which $V_1$ represents the low-side switch point of the circuit, and $V_2$ represents the high-side circuit switch point. Actual voltage values can vary in accordance with selected circuit parameters such as transistor gain and the like. The voltage (potential) difference between $V_1$ and $V_2$ is designated as $\Delta V$.

In order to minimize frequency fluctuations, it is desirable to render the low side switching voltage ($V_1$) equivalent to the current source (NMOS transistor 94) bias voltage (NB) so as to cancel circuit parameters in equation (3) above.

The low state switching voltage across NMOS transistor 92 occurs when the transistor becomes saturated and switches to the low state, represented by $V_1$ in FIG. 6. The switching voltage is given by the following relationship:

$$V_x = \sqrt{\beta \frac{I}{(W/L)_{N92} k_{N92}'}} + V_{TN92} \tag{9}$$

, where $\beta$ represents the current ratio between transistors 58 & 82; W and L respectively represent the width and length ($\mu$) of NMOS transistor 92; $k_{n92}$ represents the strength or gain of the transistor 92; and $V_{TN92}$ represents the threshold voltage of transistor 92. If it is assumed that the following parameters are equal, $$(W/L)_{N92} = \beta/\alpha (W/L)_{N60}, \text{ then } V_x = NB \, (= V_{GSN60}) \tag{10}$$

from equations (8) and (9) above.

The foregoing analysis with respect to low side voltage switch point is equally applicable to high side voltage switch point with respect to PMOS transistor 80 and NMOS transistor 94, for which switches 86 and 88 are open and switches 84 and 90 are closed. Under these circumstances, $$V_x = PB = V_{GSP56} \tag{11}$$

From the foregoing relationships, the circuit frequency (F) can be determined from the following relationship:

$$F = \frac{I}{2C(\Delta V)} = \frac{\frac{V_{DD} - V_{GSP56} - V_{GSN60}}{\alpha R}}{2C(V_{DD} - V_{GSP56} - V_{GSN60})} = \frac{1}{2\alpha RC} \tag{12}$$

where C represents capacitance of Capacitor 72 (FIG. 4); $\alpha$ represents the current ratio between transistors constituting the current mirrors 52 & 54 (FIG. 4); and R represents the resistance of circuit Resistor 64.

Figure 8:
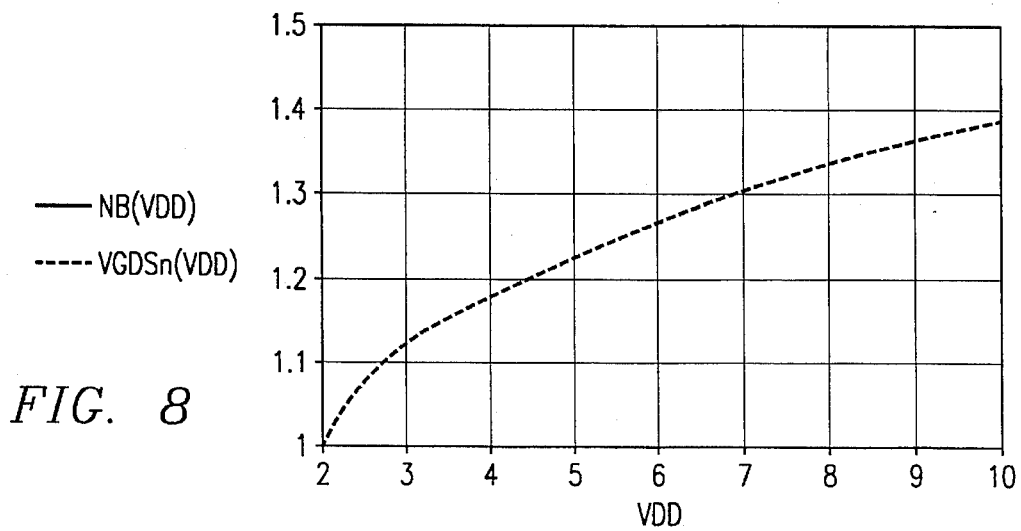
FIG. 8 is a graphic illustration of voltage outputs from the circuit depicted in FIG. 5.

FIG. 8 represents a first order graphical representation of the relationships set forth above (plot of NB in equation (8), $V_x$ in equation (9), conditions of equation (10)) and for which the following first order I/V characteristics of a MOS transistor is applicable:

$$I_D = k^1 (W/L)(V_{GS} - V_T)^2 \quad (13)$$

where $V_{TN}$=1.0 V; $V_{TP}$=1.0 V; $\alpha$=3; $\beta$=2. The first order graphical representation illustrated in FIG. 8 indicates that NB and the low sides switch point are identical, as the two graphs are superposed over one another. The same first order graphical relationship would hold true for high side voltage as well.

As has been mentioned previously, it is desirable to design an oscillator circuit such that current (I) and voltage ($\Delta V$) follow identical, or nearly identical, functions of source voltage ($V_{DD}$), temperature and transistor processing parameters. Attainment of such a circuit will create such a frequency that is independent of these three influences.

The foregoing description has focused on theoretical, first order theory for frequency-stable oscillator circuitry. In practice, a number of second order deviations necessitate modifications to the circuitry discussed above. The primary causes for these deviations are the existence of finite voltage gains from input to output, requiring a high output voltage to trigger the next circuit, and the existence of a finite time interval for hysteresis circuit output to switch between circuit high and low states (i.e., the circuit output does not switch in "zero" time). These factors are especially problematic at low current levels of the magnitude that are encountered in mobile communications power management and the like.

The foregoing adverse effects can be offset by modifying circuit components from the theoretical, first order values and by introducing additional circuit elements, as will be apparent from the following description.

Figure 9:
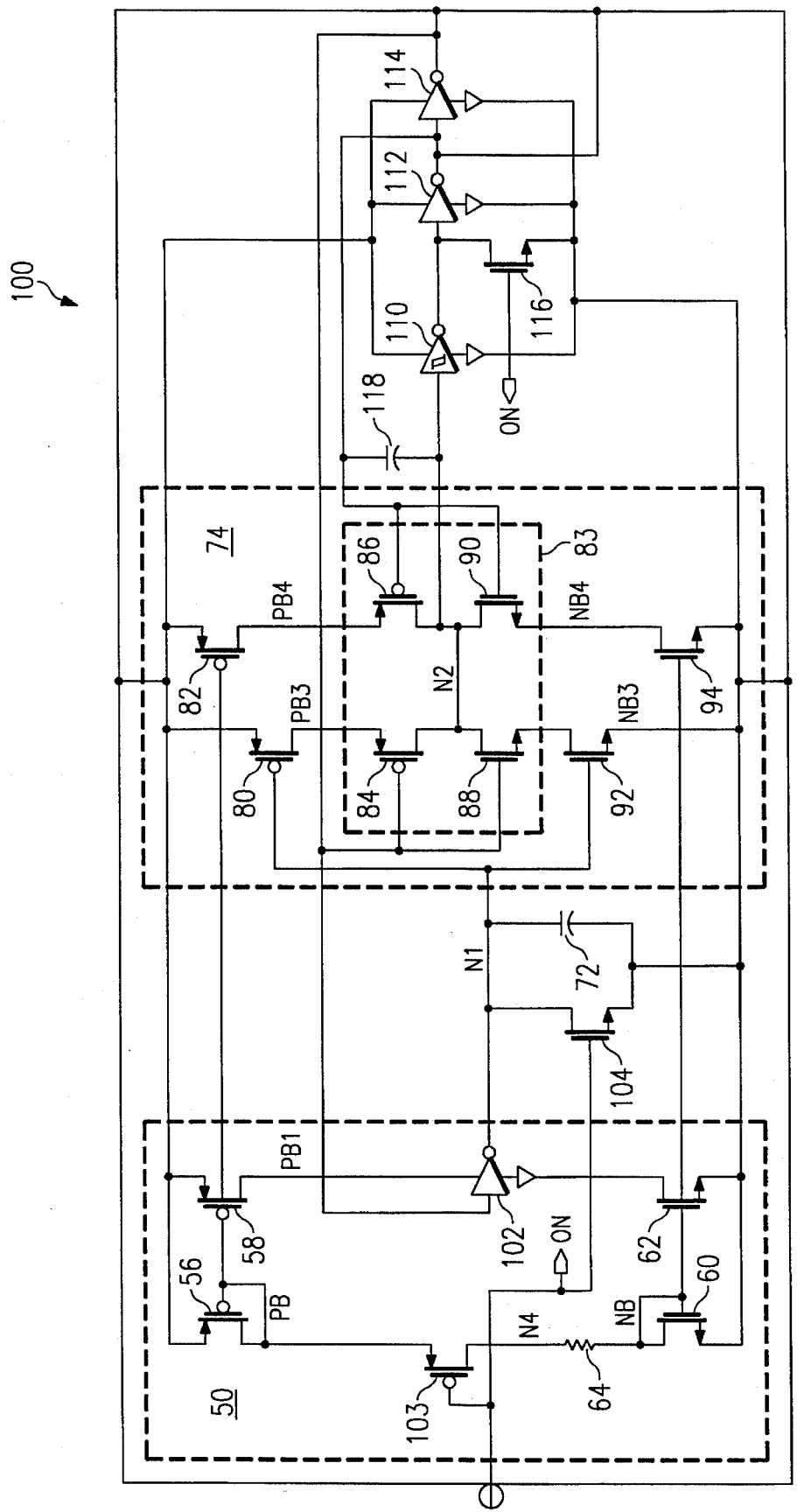
FIG. 9 is a schematic illustration of an oscillator circuit in accordance with the present invention.

With reference to FIG. 9, there is depicted an implementation of the frequency stabilized oscillator circuit of the present invention. In the illustrated embodiment, designated generally by referenced character 100, the current generator circuit 50 of FIG. 4 and the hysteresis circuit 74 of FIG. 5 are incorporated into a unitary circuit. In the circuit implementation 100, the gates of PMOS transistors 56, 58 and 82 are connected. Likewise, the gates of NMOS 60, 62 and 94 are connected, thereby coupling together the circuits 50 and 74. Resistor 64 is configured as a 500 k-Ohm resistor. Output from the capacitor 72 is directed to gate-connected PMOS transistor 80 and NMOS transistor 92. Transistor pair 66 and 68 (FIG.4) is illustrated as inverter 102 in FIG. 9. Persons of ordinary skill in the art will appreciate that these two illustrations are equivalent to one another. PMOS transistor 103 is incorporated into current generator circuit 50 to add further circuit control. Output from the inverter 102 is directed to the capacitor 72. The hysteresis circuit 74 is connected to another hysteresis inverter 110 that is in the form of a six transistor Schmitt trigger. The inverter 110 is used to accelerate the switching times of the circuit beyond that which would otherwise be obtainable. When feedback circuits like this switch too slowly, it is likely that undesired instability can result from a very high gain, multi-pole loop. Output from the inverter 110 is directed to a serial array of inverters 112 and 114, the output of which is used as the oscillator output and feedback to control all of the switches (e.g., 84, 86, 88 & 90) in the oscillator. Transistors 103, 104 & 116 permit for controlled shutdown of the circuit. Capacitor 118 facilitates maintenance of the inverter 110 in a proper state, as parasitic capacitance from nodes PB4 and NB4 would tend to bias node N2 in an improper direction when switching states.

Specific parameters for the elements comprising circuit 100 are set forth in the table below.

| FIG. 9 CIRCUIT PARAMETERS | | | |
|---|---|---|---|
| Circuit Element | Width ($\mu$) | Length ($\mu$) | Capacitance (PF) |
| PMOS (56) | 201 | 10 | — |
| PMOS (58) | 67 | 10 | — |
| NMOS (60) | 66 | 10 | — |
| NMOS (62) | 22 | 10 | — |
| CAP. (72) | — | — | 33.7 |
| PMOS (80) | 57 | 10 | — |
| PMOS (82) | 134 | 10 | — |
| PMOS (84) | 9 | 3 | — |
| PMOS (86) | 9 | 3 | — |
| NMOS (88) | 4 | 4 | — |
| NMOS (90) | 4 | 4 | — |
| NMOS (92) | 19 | 10 | — |
| NMOS (94) | 44 | 10 | — |
| PMOS (103) | 100 | 3 | — |
| NMOS (104) | 25 | 4 | — |
| NMOS (116) | 4 | 4 | — |
| CAP. (118) | — | — | 0.1 |

Deviations from the theoretical arise for the reasons discussed above (e.g., low power and finite transition times). For example, first order theoretical calculations would suggest dimensioning PMOS transistor 80 and NMOS transistor 92 to have respective width/length dimensions ($\mu$m) of 134/10 and 44/10. Instead, PMOS transistor 80 is dimensioned 57/10, whereas NMOS transistor 92 is dimensioned 19/10 to compensate for the second order deviations. Inverters 112 and 114 were added to increase output drive and internal switch drive. The inverter 110 is configured as a hysteretic inverter to inhibit simultaneous, unstable linear function of the inverters 110, 112 and 114. Capacitor 118 was added to facilitate maintenance of hysteretic inverter 110 in a proper state, as parasitic capacitance at nodes NB4 and PB4 would otherwise tend to switch the inverter 110 to an undesired state. PMOS transistor 103 and NMOS transistors 104 and 116 have been added to permit circuit shut-down to a known state, as when all currents in the circuit are reduced to zero.

Figure 10:
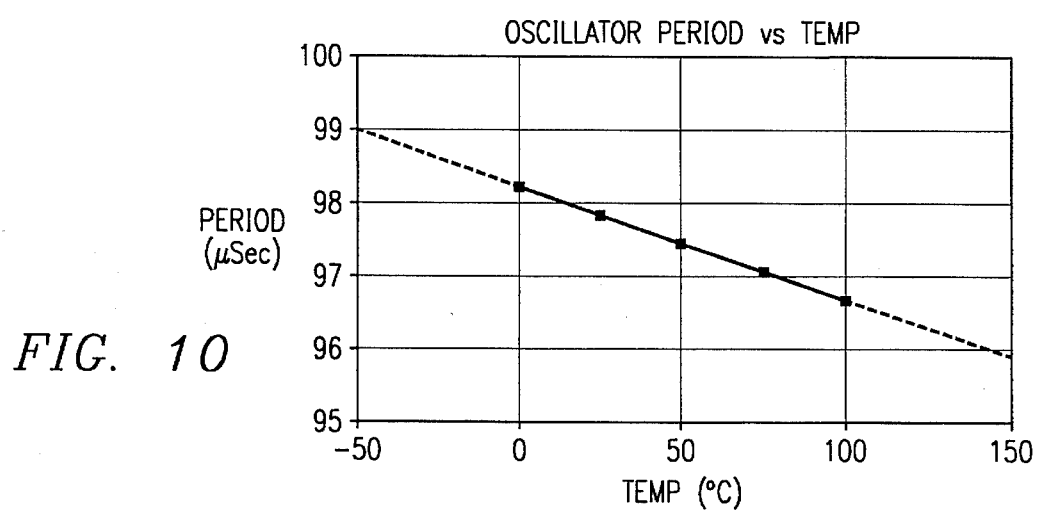
FIG. 10 is a graphical representation of measured oscillator period as a function of temperature in the present invention.
Figure 11:
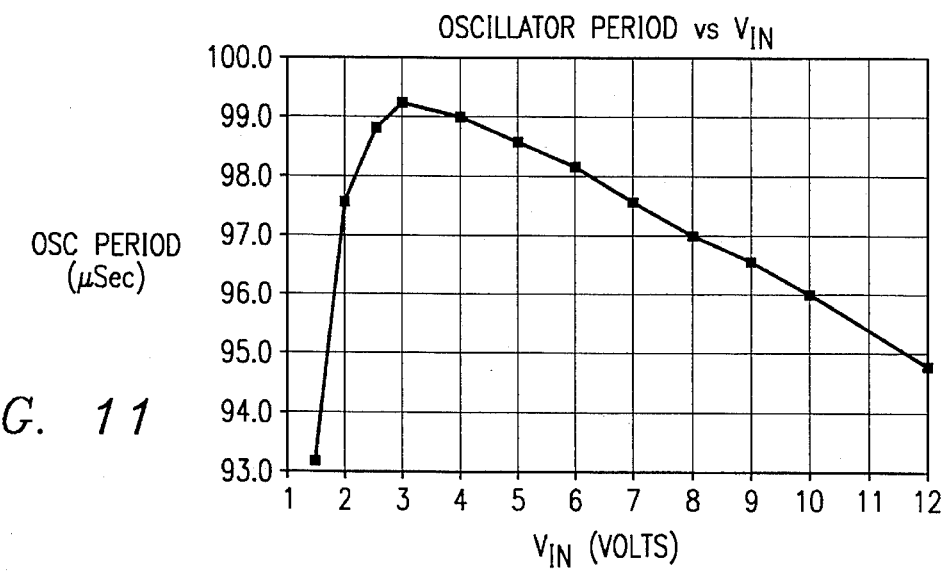
FIG. 11 is a graphical representation of measured oscillator period as a function of source voltage in the present invention.

FIGS. 10 and 11 respectively illustrate oscillator period results as a function of temperature (FIG. 10) and supply voltage (FIG. 11). Data extrapolated from actual test data is indicated by a dashed line in the respective drawing figures. The graphs validate the premise of the invention by demonstrating an output period deviation of under 3% for each of the foregoing parameters, as compared to deviations of up to 30% for each parameter with conventional oscillator circuits.

It should be understood and appreciated that, while the foregoing illustrative embodiment has been described with reference to MOSFET technology, the same principles are equally applicable to other transistors and equivalent component technologies, such as BiCMOS. The terms "source", "drain" and "gate" are used merely for reference purposes to identify the various terminals of the described transistors. It is to be appreciated that the "drain" and "source" terminals of certain field effect transistors may be interchangeable, and that the foregoing MOSFET terms are intended in this disclosure to encompass "emitter", "collector" and "base", as well as "cathode", "anode" and "grid", or equivalent terms as may be applicable for corresponding elements of other technologies.

Although the present invention and its advantages have been described in connection with the preferred embodiments, it should be understood that various changes, substitutions and alterations can be made herein without departing from the spirit and scope of the invention as defined by the appended claims.

What is claimed is:

1. An oscillator circuit, comprising:

a current generator having at least two PMOS transistors and at least two NMOS transistors, each of said transistors having first, second and gate terminals, said PMOS transistors being connected to a supply voltage terminal through their respective first terminals, said NMOS transistors being connected to a ground terminal through a first of said terminals, the second terminal of a first of said NMOS transistors being connected through a source of resistance to the second terminal of a first of said PMOS transistors;

a switch assembly connected to the second terminal of a second of said PMOS transistors and to the second terminal of a second of said NMOS transistors;

a current storage device connected to said switch assembly; and a hysteresis circuit connected to said current storage device and operable to generate a potential difference, said hysteresis circuit comprising at least one PMOS transistor and at least one NMOS transistor that are coupled to said current generator PMOS and NMOS transistors, respectively, so as to mirror current through said current generator PMOS and NMOS transistors.

2. The oscillator circuit of claim 1, wherein said switch assembly comprises an NMOS transistor and a PMOS transistor that are connected in parallel.

3. The oscillator circuit of claim 1, wherein said hysteresis circuit further comprises gate-connected second PMOS and second NMOS transistors.

4. The oscillator circuit of claim 1, wherein said hysteresis circuit comprises a switch array of diagonally opposed NMOS/PMOS transistor pairs operable in tandem such that no more than one of said pairs is closed at any given time.

5. The oscillator circuit of claim 4, further comprising a feedback control system connected to said current generator and said hysteresis circuit, said feedback control system being operable to regulate oscillator switch operation.

6. The oscillator circuit of claim 1, further comprising gate-connected second NMOS and second PMOS transistors.

7. The oscillator circuit of claim 1, further comprising an inverter assembly connected to said hysteresis circuit.

8. The oscillator circuit of claim 7, wherein said inverter assembly comprises a serial arrangement of a parallel array of inverters.

9. The oscillator circuit of claim 7, wherein said inverter assembly comprises a Schmitt trigger.

10. An oscillator circuit, comprising:

a current generator having at least two PMOS transistors and at least two NMOS transistors, each of said transistors having first, second and gate terminals, said PMOS transistors being connected to a supply voltage terminal through their respective first terminals, said NMOS transistors being connected to a ground terminal through a first of said terminals, the second terminal of a first of said NMOS transistors being connected through a source of resistance to the second terminal of a first of said PMOS transistors;

a switch assembly connected to the second terminal of a second of said PMOS transistors and to the second terminal of a second of said NMOS transistors;

a current storage device connected to said switch assembly; and a hysteresis circuit connected to said current storage device and operable to generate a potential difference, said hysteresis circuit comprising at least one PMOS transistor and at least one NMOS transistor that are coupled to said current generator PMOS and NMOS transistors, respectively, so as to mirror current through said current generator PMOS and NMOS transistors, and a switch array of diagonally opposed NMOS/PMOS transistor pairs operable in tandem such that no more than one of said pairs is closed at any given time.

11. The oscillator circuit of claim 10, wherein said switch assembly comprises an NMOS transistor and a PMOS transistor that are connected in parallel.

12. The oscillator circuit of claim 11, further comprising a feedback control system connected to said current generator and said hysteresis circuit, said feedback control system being operable to regulate oscillator switch operation.

13. The oscillator circuit of claim 12, wherein said feedback control system comprises a Schmitt trigger.

14. The oscillator circuit of claim 13, wherein said feedback control system further comprises a serial arrangement of a parallel array of inverters that are connected to said Schmitt trigger.

* * * * *